Figure 1:
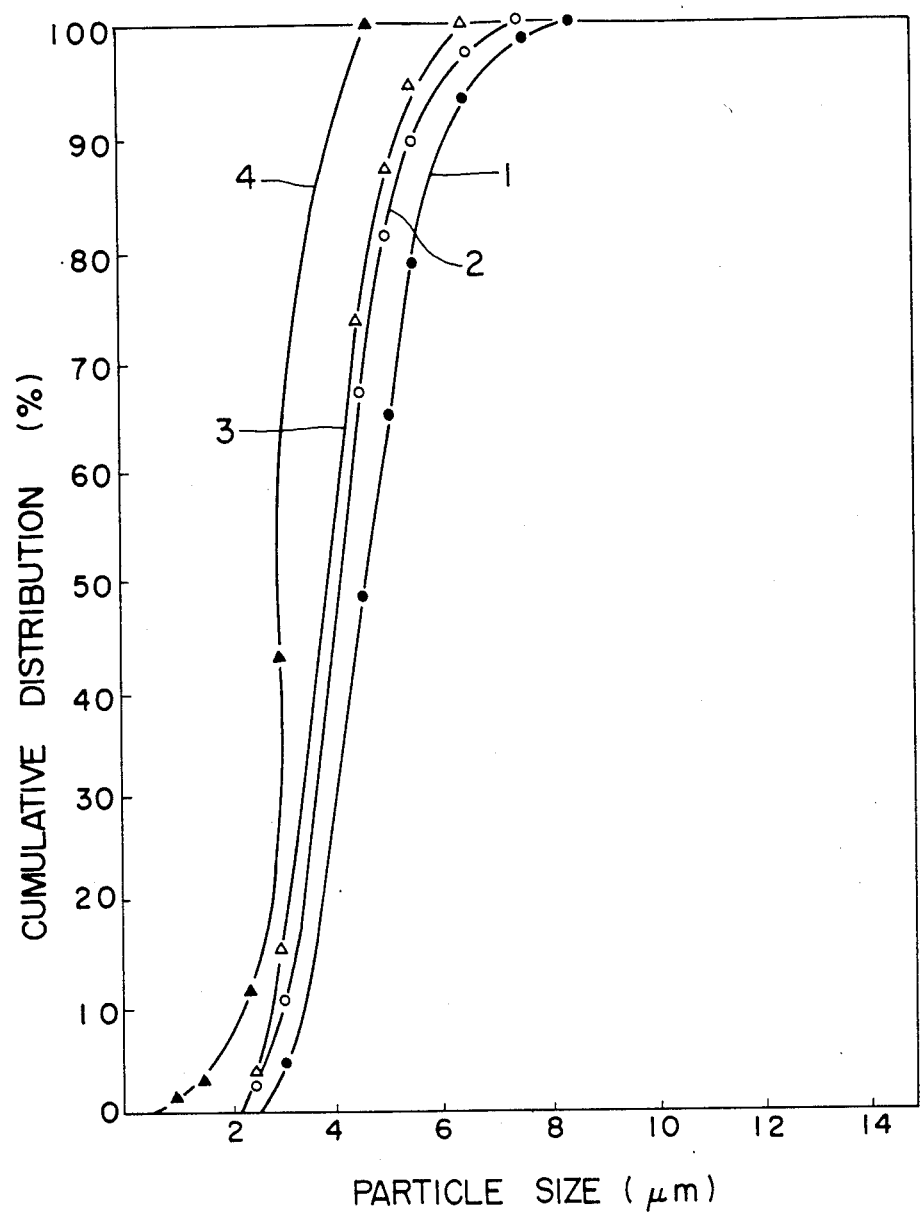

United States Patent [19]
Ozeki et al.

[11] Patent Number: 4,751,014
[45] Date of Patent: Jun. 14, 1988

[54] PIEZOELECTRIC COMPOSITE MATERIAL

[75] Inventors: Hirofumi Ozeki; Hideo Sobue, both of Nagoya, Japan

[73] Assignee: NGK Spark Plug Co. Ltd., Japan

[21] Appl. No.: 865,066

[22] Filed: May 19, 1986

[30] Foreign Application Priority Data

May 23, 1986 [JP] Japan ................... 60-112331

[51] Int. Cl.⁴ .............................. C04B 35/00
[52] U.S. Cl. .................. 252/62.9; 252/520; 524/413
[58] Field of Search ............ 252/520, 62.9; 501/134; 524/413, 430

[56] References Cited
U.S. PATENT DOCUMENTS
4,595,515  6/1986  Wakino et al. .............. 252/520

Primary Examiner—Josephine Barr
Attorney, Agent, or Firm—Darby & Darby

[57] ABSTRACT

A piezoelectric ceramic composite material useful for use in underwater transducers or hydrophones, including an elastic organic matrix, and piezoelectric ceramic powder dispersed in the substrate and having a composition:

$$Pb_{1-x}TiO_{3-x}$$

wherein x is a number of 0.005 to 0.12.

5 Claims, 2 Drawing Sheets

PIEZOELECTRIC COMPOSITE MATERIAL

This invention relates generally to a piezoelectric material and, more specifically, to a piezoelectric composite material suitable for use as a piezoelectric element of an underwater transducer or a hydrophone adapted to receive an acoustic wave or ultrasonic wave propagating in water media or to generate a sound or ultrasonic wave to water media.

Piezoelectric composites which are made of piezoelectric ceramic powder, such as lead titanate, dispersed in an organic matrix and which have a lower density as compared with single, sintered piezoelectric ceramics have a superior acoustic matching with water. Such composites also have a high flexibility and, therefore, are only sparingly influenced by a high hydraulic pressure. All the above properties of the piezoelectric composites allow the use thereof as piezoelectic elements of underwater transducers or hydrophones. Piezoelectric composite materials for use in hydrophones are desired to have as small an electric loss as possible. Thus, it is important that the piezoelectric composites should have as small a dielectric loss, tanδ, as possible.

It is, therefore, the prime object of the present invention to provide a piezoelectric composite material having a small dielectric loss, tanδ, and suitable for application to underwater transducers or hydrophones.

In accomplishing the above objects, the present invention provides a piezoelectric composite material comprising:
an organic matrix, and
piezoelectric ceramic powder having a composition $$Pb_{1-x}TiO_{3-x}$$

where x is a number of 0.005 to 0.12, and dispersed in the matrix.

The piezoelectric ceramic powder used in the piezoelectric composite material is composed of PbO and $TiO_2$. It is important that the molar ratio of PbO to $TiO_2$ should be 0.88–0.995:1 in order to prepare a piezoelectric composite having a small dielectric loss. A molar ratio of PbO to $TiO_2$ of less than 0.88:1 cannot reduce the particle size of the piezoelectric ceramic powder but, rather, tends to degrade the piezoelectric properties due to the increase of free $TiO_2$ of a paraelectric phase. The piezoelectric ceramic powder preferably has an average particle size of 2.2 to 4.0 μm.

The organic matrix or substrate into which the piezoelectric ceramic powder is dispersed, preferably homogeneously, may be an elastic material such as a synthetic rubber. Preferably, the organic matrix is a synthetic rubber, more preferably a mixture of a relatively high molecular weight synthetic rubber, such as a polychloroprene rubber, with a molecular weight of about 100000 or more and a relatively low molecular weight synthetic rubber, such as polychloroprene rubber with a molecular weight of 2000 to 100000. The mixing ratio (by weight) of the high molecular weight synthetic rubber to the low molecular weight synthetic rubber is preferably 75:25 to 40:60, more preferably 55:45 to 45:55. A high molecular weight synthetic rubber generally has advantageously a low dielectric loss but disadvantageously a high hardness. By incorporating a suitable amount of a low molecular weight synthetic rubber into the high molecular one, the resulting matrix exhibits both a low dielectric loss and a satisfactory hardness.

The amount of the piezoelectric ceramic powder in the piezoelectric composite material is preferably in the range of 40 to 80% by volume. The piezoelectric composite may further contain any suitable additive such as a vulcanizing agent. An amount of the ceramic powder below 40% by volume is insufficient to obtain a satisfactory sensitivity. On the other hand, too high a content of the ceramic powder causes difficulty in shaping or molding of the composite material.

Figure 2:
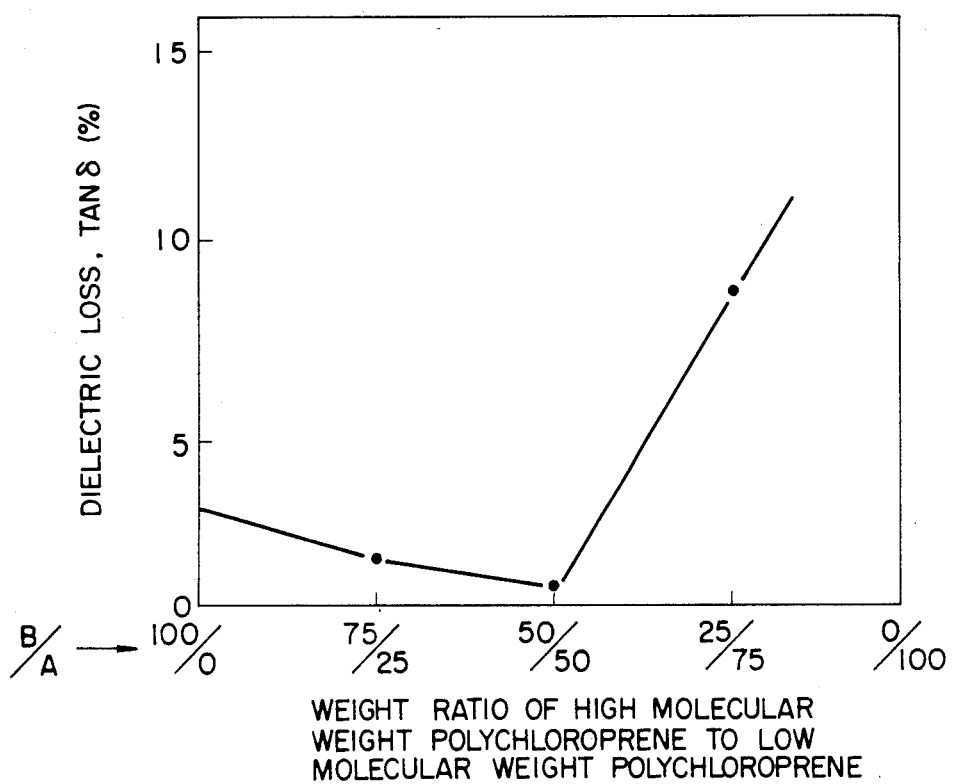

The following examples and the accompanying drawings will further illustrate the present invention. In the drawings:

FIG. 1 is a graph showing the particle size distribution of the piezoelectric ceramic powder used for the purpose of the present invention; and FIG. 2 is a graph showing the relationship between the dielectric loss, tanδ, and the mixing ratio of the high molecular weight polychloroprene to the low molecular weight polychloroprene of the organic matrix.

EXAMPLES 1-6

Preparation of Piezoelectric Ceramic Powder

PbO powder having an average particle size of 3 μm or less and $TiO_2$ powder having an average particle size of 2 μm or less were mixed with various mixing ratios providing $Pb_{1-x}TiO_{3-x}$ where x is 0.005 (Example 1), 0.010 (Example 2), 0.014 (Example 3), 0.028 (Example 4), 0.070 (Example 5), 0.120 (Example 6) and 0 (control). Each mixture (2.5 Kg) was then commingled by means of a vibrating mill containing 3.5 Kg of alumina balls for 3 hours under dry conditions. The vibration mill used had a pot whose inside wall was lined with an urethane resin to prevent the inclusion of impurities in the mixture. The resulting admixture was placed in a mold and pressed at a pressure of 350 Kg/cm² to obtain tablets having a diameter of 47 mm, a thickness of 5 mm and a density of 4.5 g/cm³. The tablets are then heat treated in a high alumina crusible at 1050° C. for 2 hours to effect solid phase reaction. The heated mass was then quenched with water in a vessel to give finely divided solid particles. To facilitate the pulverization, the content in the vessel was stirred by means of a propellar type agitator for 5 hours. The resultant mixture in the vessel was then allowed to pass through a 280 mesh sieve, followed by dewatering and drying at 100° C. for 24 hours, whereby finely divided lead titanate powder having the above-described compositions were obtained. The particle size distribution of the piezoelectric ceramic powder of Examples 1, 2, 3 and 5 are shown in FIG. 1 by way of cumulative distribution. The particle size distribution was measured by a sedimentation specific gravity balance method. In FIG. 1, the curves 1 through 4 represent the particle size distribution of the ceramic powder of Examples 1, 2, 3 and 5, respectively. The average particle sizes of the piezoelectric ceramic powder are shown in Table below.

PREPARATION OF PIEZOELECTRIC COMPOSITES

Each of the thus obtained piezoelectric ceramic powder (40 vol %) was mixed with a chloroprene rubber (60 vol %), with which was further mixed a vulcanizing agent composed of 20 parts by weight of $Pb_3O_4$, 5 parts by weight of ZnO and 0.5 part by weight of dibenzothiazolyl disulfide. The vulcanizing agent was used in an amount of 25.5 parts by weight per 100 parts by weight of the chloroprene rubber. The chloroprene rubber was a mixture of 50 wt % of a low molecular weight polychloroprene having a molecular weight of about 10,000 and 50 wt % of a high molecular weight polychloroprene having a molecular weight of about 250,000. The thus obtained compositions were each subjected to roll molding and then to a heat press treatment at a temperature of 180° C. and a pressure of 90 Kg/cm² for 20 min by means of a vulcanizing press machine, thereby to obtain a piezolelectric composite sheet having a size of 150×150×2 mm. A silver paste was appplied on both sides of the composite sheet to form rectangular electrodes. The resulting sheet was immersed in an insulating liquid and applied with a 100 KV/cm direct current voltage at 20° C. for 1 hour to effect poling. The resulting piezoeletric composite sheet was used as a piezoelectric element of a hydrophone and tested for its piezoelectric properties. The results were as summarized in Table below.

TABLE

| Example | Piezoelectric Ceramics | | Properties of Piezoelectric Composites | | | | |
|---|---|---|---|---|---|---|---|
| | $x$ | Average Particle size (μm) | Dielectric Constant $\epsilon_3 T_3$ *1 | Dielectric Loss *2 $\tan\delta$, (%) | Piezoelectric Charge Constant $d_h$ ($10^{-12}$ C/N) *3 | Piezoelectric Stress Constant $g_h$ ($10^{-3}$ Vm/N) | $d_h \times g_h$ ($10^{-15}$ m²/N) |
| 1 | 0.005 | 4.0 | 40.9 | 1.5 | 23.5 | 64.9 | 1520 |
| 2 | 0.010 | 3.5 | 40.2 | 1.5 | 23.6 | 66.1 | 1560 |
| 3 | 0.014 | — | 40.3 | 1.5 | 21.7 | 60.8 | 1320 |
| 4 | 0.028 | 2.6 | 41.6 | 1.5 | 20.9 | 56.7 | 1200 |
| 5 | 0.070 | 2.4 | 39.7 | 1.5 | 21.5 | 51.2 | 1310 |
| 6 | 0.120 | 2.2 | 43.9 | 1.5 | 20.1 | 51.6 | 1040 |
| Control | 0 | 7.4 | 41.0 | 2.4 | 23.3 | 64.7 | 1510 |

| Example | $\dfrac{d_h \times g_h}{\tan\delta}$ ($10^{-13}$ m²/N) | $d_{33}$ ($10^{-12}$ C/N) | $d_{31}$ ($10^{-12}$ C/N) | $\dfrac{d_{33}}{|d_{31}|}$ *4 | $g_{33}$ *5 ($10^{-3}$ Vm/N) | Mv *6 (dB) | Electric Resistance $\rho$ ($10^{11}$ Ωcm) |
|---|---|---|---|---|---|---|---|
| 1 | 1010 | 51 | −13.8 | 3.7 | 140.7 | −97.4 | 3.9 |
| 2 | 1040 | 49 | −12.7 | 3.9 | 137.6 | −97.2 | 3.9 |
| 3 | 880 | 44 | −11.2 | 3.9 | 123.2 | −97.9 | 4.3 |
| 4 | 800 | 39 | −9.1 | 4.3 | 105.8 | −98.9 | 5.7 |
| 5 | 880 | 37 | −7.8 | 4.8 | 105.3 | −98.3 | 1.2 |
| 6 | 700 | 33 | −5.5 | 5.7 | 79.8 | −99.7 | 2.6 |
| Control | 630 | 64 | −20.4 | 3.1 | 176.2 | −97.8 | 1.0 |

*1, *2: Measured with a frequency of 1 KHz
*3: Measured with a frequency of 40 Hz
*4, *5: Measured with a frequency of 40 Hz
*6: 0 dB = 1 V/bar From the results shown in the above Table, it is appreciated that the piezoeletric composites containing ceramic powder $Pb_{1-x}TiO_{3-x}$ ($x$ is a number of 0.005 to 0.12) have a smaller dielectric loss, $\tan\delta$, and an improved figure of merit factor $(d_h \times g_h)/\tan\delta$ as compared with the control. Therefore, the piezoelectric composites of the present invention are very suited for us in underwater transducers and hydrophones.

EXAMPLE 7

Example 2 was repeated in the same manner as described except that the weight ratio of high molecular weight polychloroprene to low molecular weight polychlroprene of the chloroprene rubber was changed to 100:0, 75:25, 25:75 and 0:100. The inductive loss of the resulting piezoelectric composites are shown in FIG. 2. Similar relationship between the inductive loss and the weight ratio was observed with the piezoelectric ceramic powder of Examples 1 and 3 through 6.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A piezoelectric composite material comprising:
   an elastic organic matrix exhibiting a low dielectric loss, and
   a piezoelectric ceramic powder dispersed in the matrix, having a content in said composite material of from 40 to 80% by volume, and having a composition $$Pb_{1-x}TiO_{3-x}$$

where $x$ is a number of 0.005 to 0.12.

2. A piezoelectric composite material according to claim 1, wherein said organic matrix is formed of a synthetic rubber.

3. A piezoelectric composite material according to claim 2, wherein said organic matrix is formed of a mixture of a first synthetic rubber having a molecular weight of 2000 to 100000 and a second synthetic rubber having a molecular weight of 100000 or more, the weight ratio of said second to first synthetic rubber being in the range of 75:25 to 40:60.

4. A piezoelectric underwater transducer comprising a piezoelectric element formed of the piezoelectric composite material according to claim 1.

5. A piezoelectric composite material comprising:
   an organic matrix formed from a mixture of a first synthetic rubber having a molecular weight of from 2000 to 100,000 and a second synthetic rubber having a molecular weight of at least 100,000, wherein the ratio by weight of first to second synthetic rubber is within the range of 75:25 and 40:60; and
   a piezoelectric ceramic powder dispersed in the matrix and having a composition $$Pb_{1-x}TiO_{3-x}$$

where $x$ is a number of 0.005 to 0.12, and wherein the content of said piezoelectric ceramic powder in said composite material is 40 to 80% by volume.

* * * * *